United States Patent [19]
Ng et al.

(10) Patent No.: US 11,749,368 B2
(45) Date of Patent: Sep. 5, 2023

(54) QUICK CONFIGURABLE UNIVERSAL REGISTER FOR A CONFIGURABLE INTEGRATED CIRCUIT DIE

(71) Applicant: Intel Corporation, Santa Clara, CA (US)

(72) Inventors: Bee Yee Ng, Penang (MY); Dana How, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 737 days.

(21) Appl. No.: 16/729,085

(22) Filed: Dec. 27, 2019

(65) Prior Publication Data
US 2020/0135289 A1 Apr. 30, 2020

(51) Int. Cl.
G11C 29/12 (2006.01)
G11C 29/56 (2006.01)
G11C 29/00 (2006.01)
G11C 29/14 (2006.01)
G06F 15/78 (2006.01)

(52) U.S. Cl.
CPC .... G11C 29/12015 (2013.01); G06F 15/7807 (2013.01); G11C 29/14 (2013.01); G11C 29/56008 (2013.01); G11C 29/789 (2013.01); G11C 2029/1206 (2013.01)

(58) Field of Classification Search
CPC .......... G06F 15/7807; G11C 29/12015; G11C 29/14; G11C 29/56008; G11C 29/789; G11C 2029/1206; G11C 29/48
See application file for complete search history.

(56) References Cited

U.S. PATENT DOCUMENTS

| 5,056,094 A | * | 10/1991 | Whetsel ........... G01R 31/31858 714/724 |
| 5,181,191 A | * | 1/1993 | Farwell .......... G01R 31/318552 324/73.1 |
| 2004/0199839 A1 | * | 10/2004 | Whetsel, Jr. ... G01R 31/318555 714/726 |
| 2016/0112036 A1 | * | 4/2016 | Goyal ................ H03K 3/35625 327/203 |

* cited by examiner

Primary Examiner — Ajay Ojha
(74) Attorney, Agent, or Firm — InventIQ Legal LLP

(57) ABSTRACT

An FPGA includes a number of logic elements in a core fabric. Each logic element includes a number of registers and each register includes a registered circuit path and a combinatorial circuit path. The registered and combinatorial circuit paths are in parallel. Each register includes a DFT circuit path that comprises an input in the registered circuit path and an output in the registered circuit path. The DFT circuit path is not in series with the registered circuit path and is not in series with the combinatorial circuit path. Each register includes a CE time-borrowing circuit path. Each the CE time-borrowing circuit path includes an input in the registered circuit path and an output that is coupled to the input of the registered circuit path. The CE time-borrowing circuit path is not in series with the registered circuit path and is not in series with the combinatorial circuit path.

20 Claims, 13 Drawing Sheets

| CE | nSCLR | Register Input (Din) | Function |
|---|---|---|---|
| 0 | 0 | Q | Hold previous value |
| 0 | 1 | Q | Hold previous value |
| 1 | 0 | 0 | Synchronous Clear |
| 1 | 1 | Combinatorial Input | Registered |

Fig. 4

| frzlogic | dftunload | c_flop | c_wire | ML | MS | MH | SL | SS | SH | Configurable Register Operating Mode | Properties |
|---|---|---|---|---|---|---|---|---|---|---|---|
| 1 | 0 | X | X | 0 | 0 | 1 | 0 | 1 | 0 | Configuration mode and Enter regscan mode | 1. LEOUT to interconnect is 1  2. Master latch is enabled to hold value 0 when entering user mode  3. Predetermined register value is (asynchronous clear) |
| 1 | 1 | X | X | 0 | mclk | mclk' | 0 | sclk | sclk' | Exit regscan mode | |
| 0 | 0 | 0 | 0 | 0 | 0 | 1 | 0 | 1 | 0 | User mode: unused mode (default mode) | 1. LEOUT to interconnect is 1 when entering user mode  2. Master latch is enabled to hold value 0 |
| 0 | 0 | 0 | 1 | 0 | 0 | 1 | 1 | 1 | 0 | User mode: wire mode (bypass mode) | Combinatorial output to interconnect |
| 0 | 0 | 1 | 0 | mclk | 0 | mclk' | 0 | sclk | sclk' | User mode: register mode, latch mode, and time borrowing mode | Register, latch, and continuous window-based time-borrowing modes are determined by the master clock (mclk) and slave clock (sclk) configurations |
| 0 | 0 | 1 | 1 | mclk | 0 | mclk' | 1 | sclk | sclk' | HiPi retime mode | Support HiPi retime with clock enable (CE) and synchronous clear (SCLR) |
| 0 | 1 | 0 | 0 | 0 | mclk | mclk' | 0 | sclk | sclk' | Test capture mode: unused mode | |
| 0 | 1 | 0 | 1 | 0 | mclk | mclk' | 1 | sclk | sclk' | Test capture mode: wire mode | |
| 0 | 1 | 1 | 0 | 0 | mclk | mclk' | 0 | sclk | sclk' | ASIC emulation mode and Test capture mode: register mode, latch mode, and time borrowing mode | ASIC emulation is supported when the configurable FF is configured to register mode and latch mode |
| 0 | 1 | 1 | 1 | 0 | mclk | mclk' | 1 | sclk | sclk' | Test capture mode: HiPi retime mode | |

Fig. 5

QUICK CONFIGURABLE UNIVERSAL REGISTER FOR A CONFIGURABLE INTEGRATED CIRCUIT DIE

FIELD OF THE DISCLOSURE

The present disclosure relates to a register for a configurable integrated circuit die. More specifically, the present disclosure relates to a configurable universal register for the logic array blocks of a configurable integrated circuit die that reduces setup timing and output timing.

BACKGROUND OF THE INVENTION

Configurable integrated circuit dies are configurable to implement a variety of circuit devices. The different circuit devices may have different performance and power requirements. The registers in the logic array blocks of a configurable integrated circuit die may adversely affect or positively affect the performance of the logic array blocks and the die depending on the configurations of the registers.

Thus, an impetus exists to provide registers for logic array blocks of configurable integrated circuit dies that improve timing performance by reducing timing parameters, such as setup times and output times.

BRIEF DESCRIPTION OF THE DRAWINGS

FIG. 4 shows a table of select signals that may be applied to select lines of the multiplexer for configuring the output from the multiplexer into the register for enabling or clearing the register.

FIG. 5 shows a table of the operating modes of the register and shows the states of the configuration bits, control signals, and clocks for the operating modes, in an embodiment.

DETAILED DESCRIPTION

Configurable integrated circuit (IC) dies that are often packaged discretely and as system-in-package (SiP) devices continue to fuel development in IC markets. Circuit emulation markets, ASIC prototyping markets, and data center markets are a few of the developing IC markets fueled by configurable IC dies. Configurable IC dies directed toward circuit emulation markets often include several configurable IC dies packaged as a SiP to facilitate an almost unlimited number of emulated circuits where a single configurable IC die may be unable to supply sufficient programmable fabric for implementing an emulation circuit. Configurable IC dies directed toward ASIC prototyping markets often include a number of configurable ICs dies packaged as a SiP to implement a variety of ASICs. Configurable IC dies directed toward data center markets are often discretely packaged or packaged as SiPs to facilitate ASIC functions in the data center, acceleration in the data center, to add processing capability, to add network and virtual network capability, to add non-volatile memory express capability, or other capabilities.

Configurable IC dies directed toward these markets and other markets may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable IC dies typically include a number of configurable logic blocks that may be configured to implement various circuits. The logic blocks are interconnected by configurable interconnect structures that may be configured to interconnect the logic blocks in almost any desired configuration to provide almost any desired circuit.

The circuits configured into the core fabric of a configurable IC die may perform at relatively high operating speeds if the basic building blocks of the core fabric are designed for high performance. For example, if the registers of the logic array blocks of a configurable IC die have improved setup timing and output timing, then the registers and the configurable IC die may operate at relatively fast operating speeds. Traditional registers have a number of circuit elements along the input-output path of the registers. These circuits along the input-output path of the registers may increase setup timing for the registers, may increase the output timing of the registers, or both. For example, clock setup timing, combinatorial output timing, clocked output timing, or any combination of these timings may be adversely affected when one or more circuits are in the input-output. Register embodiments described below are designed to decrease setup timing and decrease output timing by removal of circuits along the input-output path of the register embodiments while maintaining the functionality of the circuits in the registres that are removed from the input-output path.

Figure 1:
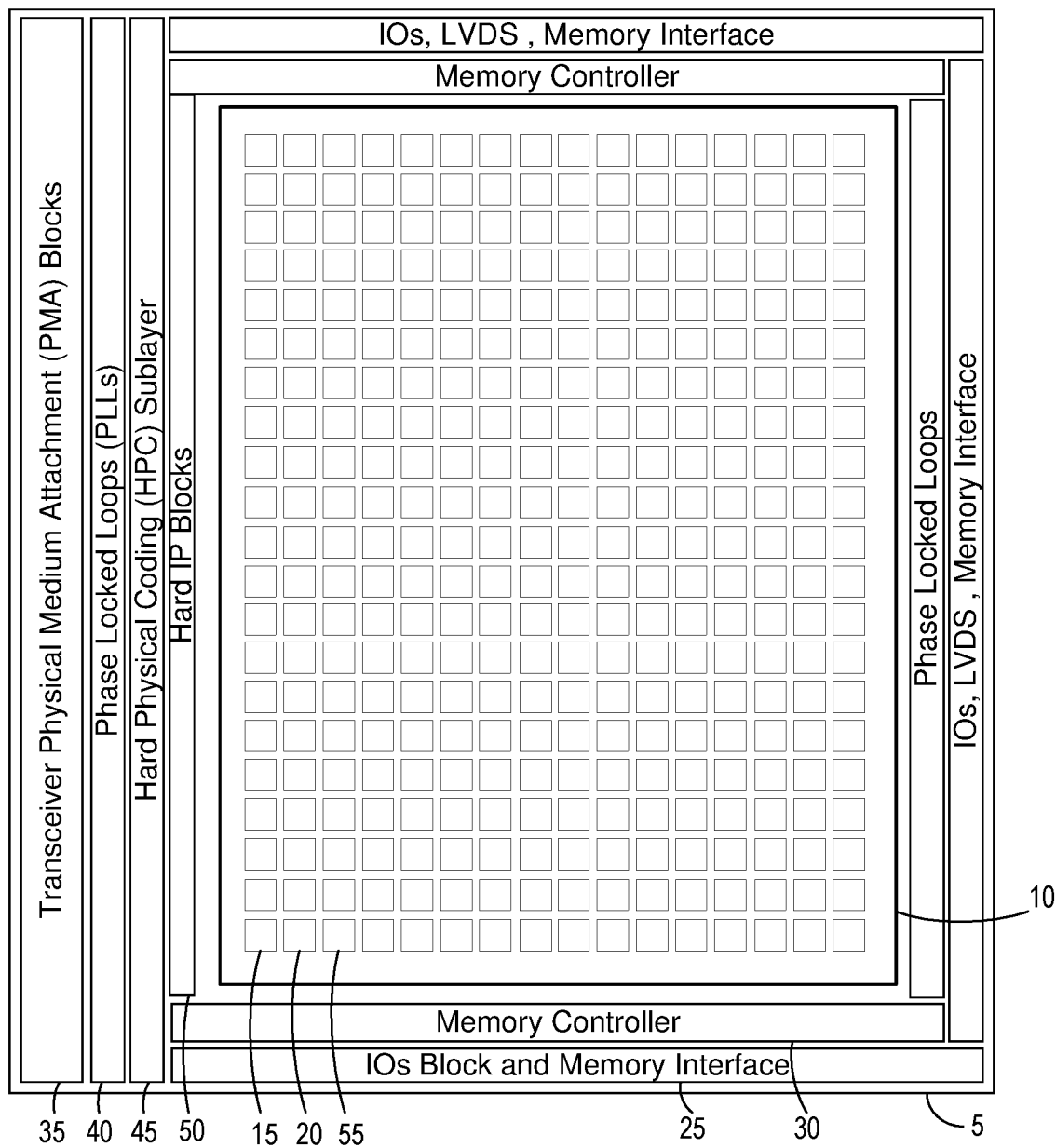
FIG. 1 illustrates a configurable integrated circuit (IC) die, in an embodiment.

FIG. 1 illustrates a configurable integrated circuit (IC) die 5, in an embodiment. The configurable IC die 5 includes a core fabric 10 and a periphery portion of hardened circuits. The hardened circuits may include an input-output (IO) block and memory interface 25, a memory controller 30, a transceiver physical medium attachment (PMA) block 35, one or more phased locked loop (PLL) blocks 40, a hard physical coding (HPC) sublayer 45, and one or more hard intellectual property (IC) blocks 50. The configurable IC die may include one or more of these hardened circuits in any combination.

The core fabric may include a number of columns 15 of logic array blocks, one or more columns 20 of configurable random access memories (CRAMs), and one or more columns 55 of random access memory blocks. The core fabric may include circuit devices, such as one or more columns of digital signal processors.

Figure 2:
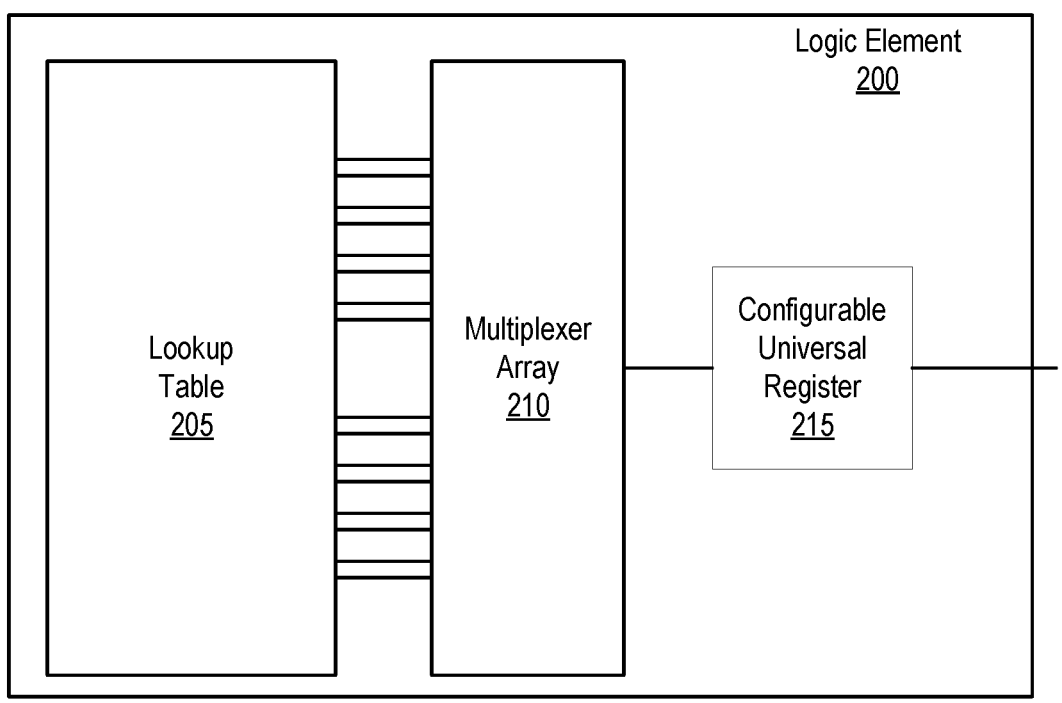
FIG. 2 illustrates a logic element that may be included in one of the logic array blocks of a configurable IC die.

FIG. 2 illustrates a logic element 200 that may be included in one of the logic array blocks. A logic array block may include a number of logic elements. The logic element may include one or more lookup tables 205, one or more multiplexer arrays 210, and one or more registers 215. The lookup table may include a static random access memory (SRAM) array that is connected to the multiplexer array. The multiplexer array may be connected to the register and may be positioned between the lookup table and the register. The register may be configured for registered output or combinatorial output. The SRAM array and multiplexer array may implement a number of combinatorial logic functions where a result of a combinatorial logic function may be output from the logic element by the register.

Figure 3:
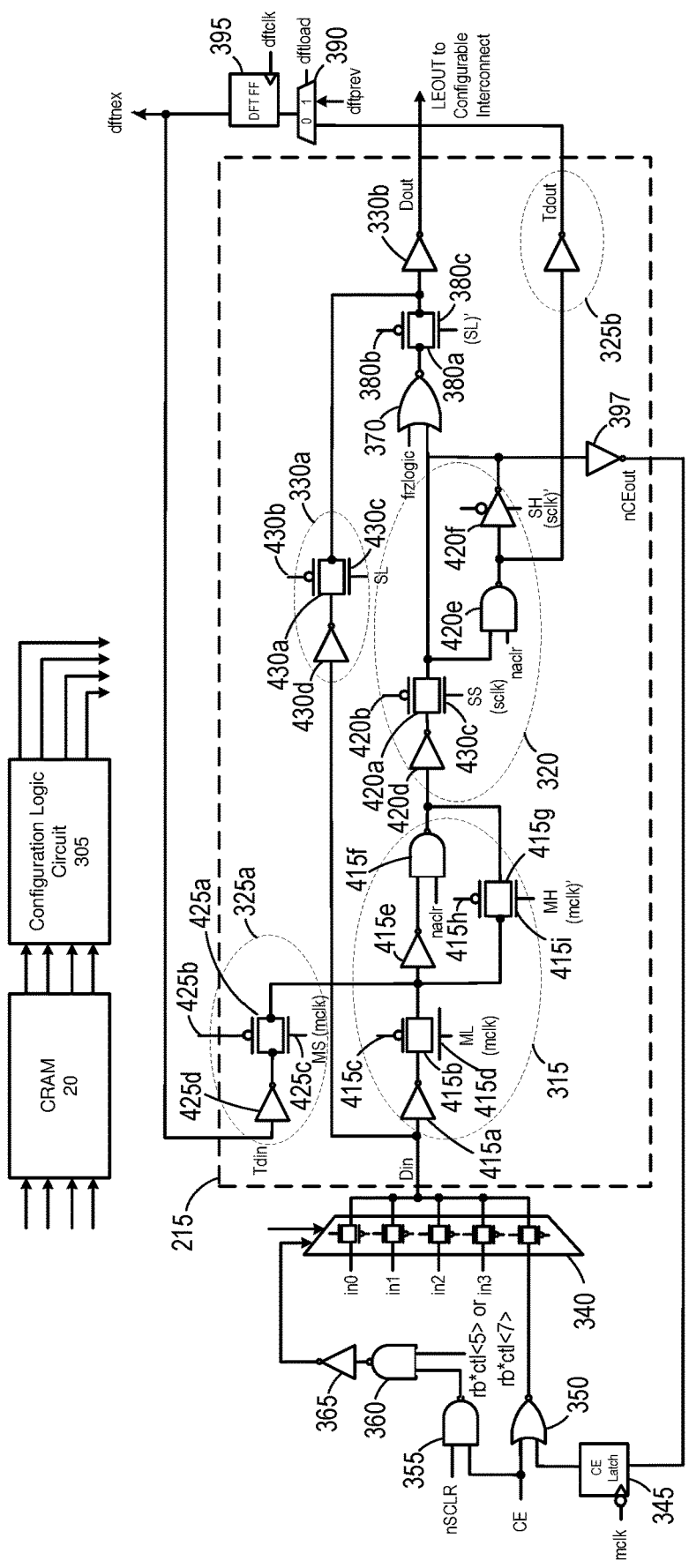
FIG. 3 illustrates a register of a logic array block of a configurable IC die, in an embodiment.

FIG. 3 illustrates a register 215, in an embodiment. Register 215 is indicated by the dashed line in FIG. 3. The register includes a master latch 315, a slave latch 320, and an ASIC emulation and design for test (DFT) circuit that comprises two circuit 325a and 325b. The register includes a combinatorial circuit 330a for a combinatorial circuit path of the register and includes an output buffer 330b that is included in both the combinatorial path and a clocked output path, which is sometimes referred to as the registered circuit path. The register includes a first logic gate (e.g., a NOR gate) 370, a passgate 380a, and an output buffer 397, which is configured to support continuous window-based time borrowing mode with CE (clock enable).

A number of circuits may be connected to register 215 and may be in the core fabric of the configurable IC die. The circuits may include one or more of the CRAMs 20, a configuration logic gate 305, a multiplexer 340, a negative-transparent latch 345, a first logic gate (e.g., an NOR gate) 350, a second logic gate (e.g., a NAND gate) 355, third logic gate (e.g., a NAND gate) 360, a buffer 365, a multiplexer 390, and a register (e.g., a flip flop) 395.

Register 215 includes a data input line (Din) and a data output line (Dout). Din is connected to an input of the registered circuit path and an input of the combinatorial circuit path. The registered circuit path includes the master and slave latches, logic gate 370, and passgate 380a. The combinatorial circuit path includes the combinatorial circuit 330a. The node between the output of control gate 380a and the input of buffer 330b is the output for both of the registered circuit path and the combinatorial circuit path. Between Din and the output for the registered and combinatorial circuit paths, the registered and combinatorial circuit paths are arranged in parallel. Din is the input for the master latch 315 and is the input for combinatorial circuit 330a. Dout is connected to an output of buffer 330b, which is configured to buffer the output for the registered and combinatorial circuit paths.

In an embodiment, the master latch and the slave latch of the registered circuit path are arranged in series. The master and slave latches are also arranged in series with logic gate 370, passgate 380a, and buffer 330b. The combinatorial circuit is also arranged in series with buffer 330b.

Master latch 315 includes an input buffer 415a (e.g., an inverting buffer), a passgate 415b, a buffer 415e (e.g., an inverting buffer), a logic gate 415f (a NAND gate), and a passgate 415g. Din is the input to the input buffer 415a. The output of the input buffer is connected to an input (e.g., a source-drain region) of passgate 415b. The output (e.g., a source-drain region) is connected to the input of buffer 415e. The output of the buffer is connected to one of the inputs of logic gate 415f. The output of the logic gate is connected to the input (e.g., a source-drain region) of passgate 415g and to the input of slave latch 320. The output (e.g., a source-drain region) of passgate 415g is connected to the input of buffer 415e. The buffer 415e, logic gate 415f, and passgate 415g are arranged in a feedback loop that locks the state of the master latch. A second input of the logic gate 415f can be adapted to receive a clear signal naclr (negative edge triggered asynchronous clear) that resets the feedback loop of the master latch. Both of the passgates 415b and 415g may be clocked circuits that are clocked by clock signals, labeled ML and MH respectively (master clock, also referred to as mclk or mclk') in FIG. 3. Passgate 415b may clock input into the master latch and passgate 415g may clock the feedback loop of the master latch.

The slave latch includes an input buffer 420d (e.g., an inverting buffer), a passgate 420a, a logic gate 420e (e.g., a NAND gate), and buffer 420f (e.g., an inverting tristate buffer). The input of input buffer 420d is the input of the slave latch. The output of input buffer 420d is connected to an input (e.g., a source-drain region) of passgate 420a. An output of the passgate is connected to one of the inputs of logic gate 420e and to an output of the slave latch. An output of the logic gate is connected to the input of buffer 420f and to the input of buffer 325b (e.g., an inverting buffer). The logic gate 420e and buffer 420f are arranged in a feedback loop that locks the state of the slave latch. A second input of the logic gate 420e may be adapted to receive a clear signal (naclr) that resets the feedback loop of the slave latch. Passgate 420a and inverting tristate buffer 420f may be clocked circuits that are clocked by clock signals, labeled SS and SH respectively (slave clock, also referred to as sclk or sclk') in FIG. 3. Passgate 420b may clock input into the slave latch and inverting tristate buffer 420f may clock the feedback loop of the slave latch.

The output of the slave latch is connected to the input of logic gate 370. A second input of the logic gate 370 can be adapted to receive a freeze logic signal (frzlogic) that prevents the input on the first input of the logic gate from propagating to the output of the logic gate. The output of logic gate 370 is connected to the input (e.g., a source-drain region) of passgate 380a. The output of the passgate 380a can be connected to the input of buffer 330b. Passgate 380a may be enabled and disabled by a control signal that is labeled (SL)' in FIG. 3. Buffer 420f may be a clocked circuit that is clocked by a clock signal, labeled SH (sclk') in FIG. 3. Buffer 420f may clock the feedback loop of the slave latch.

In an embodiment, combinatorial circuit 330a includes a buffer 430d (e.g., inverting buffer) and a passgate 430a. An input of the buffer may be connected to Din. The output of the buffer may be connected to an input (e.g., a source-drain region) of passgate 430a. An output (e.g., a source-drain region) of the passgate may be connected to the input of buffer 330b. Passgate 430b may be enabled and disabled by a control signal that is labeled SL in FIG. 3.

The output of logic gate 420e of the slave latch is also connected to the input of buffer 325b (e.g., an inverting buffer), which is included in a portion of ASIC emulation and DFT logic circuit path, which includes ASIC emulation and DFT logic circuit gates 325a. The output of buffer 325b is connected to a first input of multiplexer 390. A second input of the multiplexer is configured to receive a control signal (e.g., dftprev). The select input of the multiplexer is adapted to receive a signal (dftload) that controls whether the output of buffer 325b or the dftprev signal is output to flip flop 395. The flip-flop may be configured to receive a clock signal (dftclk) that clocks the output of the multiplexer or dftprev signal to the input of buffer 425d (e.g., inverting buffer). The output of buffer 425d is connected to an input (e.g., source-drain regions) of passgate 425a. An output (e.g., a source-drain region) of passgate 425a is connected to the input of buffer 415e of the master latch.

The output of the slave latch is connected to the input of buffer 397 (e.g., an inverting buffer). The output of buffer 397 is connected to an input of negative-transparent latch 345 that is a clocked circuit, which may be clocked by a clock signal (mclk) of the logic array block. The output of the latch is connected to a first input of logic gate (e.g., a NOR gate) 350. The second input of the logic gate may receive a highly pipelined clock enable signal (CE signal) when the signal is asserted. The output of the logic gate is connected to one of the multiplexer inputs. The multiplexer may include a number of other inputs, such as four other inputs (e.g., in0, in1, in2, and in3).

Logic gate 355 includes a first input that is adapted to receive the CE signal when the signal is asserted. A second input of the logic gate is adapted to receive a clear signal (nSCLR) for the highly pipelined mode when the signal is asserted.

The output of logic gate 335 is connected to a first input of logic gate 360. A second input of logic gate 360 is adapted to receive one or more configuration signals (e.g., rb*ctl<5> or rb*ctl<7>) when one of the configuration signals is asserted. The output of logic gate 360 is connected to the input of buffer 365 (e.g., an inverting buffer). The output of buffer 365 is connected to a first select input of multiplexer 340. A second select input of the multiplexer is adapted to receive other control signals for selecting the input of the multiplexer that is connected to the output of the multiplexer.

In an embodiment, the circuit path for the ASIC emulation and DFT circuits 325a and 325b is not in series with the registered circuit path or the combinatorial circuit path. The circuit path for the ASIC emulation and DFT circuits includes an input that is connected between the output of logic gate 420e and the input of buffer 420f of the slave latch and an output that is connected to the input of the feedback loop of the master latch. When the circuit path for the ASIC emulation and DFT circuits are configured to operate in the register, the circuit path does not negatively affect the setup time (Tsu) or the output time (Tco) of the register because the circuit path is not in series with either the registered circuit path or the combinatorial circuit path. Also, when the circuit path is not configured to operate in the register, the circuit path does not negatively affect the setup time or the output time of the register. That is, while ASIC emulation and DFT functionality are provided by the register, the circuits providing this functionality do not negatively affect the timing (Tsu and Tco) of the register. The described configuration bits, control signals, or both may control various circuits (sometimes referred to as off-path clock steering logic) that enable the ASIC emulation and DFT circuits for use in the register.

In an embodiment, the circuit path for the continuous window-based time borrowing mode with CE circuits, which includes buffer 397, latch 345, and logic gate 350, is not in series with the registered circuit path or the combinatorial circuit path. The circuit path for the CE time borrowing circuit includes an input that is connected to the output of the slave latch and an output that is connected to one of the data inputs of the multiplexer. When the circuit path for the CE time borrowing circuit is configured to operate in the register, the circuit path does not negatively affect the setup time (Tsu) and output time (Tco). That is, while time borrowing functionality is provided by the register, the design of the time borrowing circuit path does not negatively affect the timing of the register.

In an embodiment, CRAM 20 is configured to store configuration bits for configuring the register. The CRAM includes a number of inputs for receiving address information for retrieving the configuration bits. The CRAM includes a number of outputs that are connected to the inputs of the configuration logic gate. After retrieval of the configuration bits, the CRAM may transfer the configuration bits to the configuration logic gate. The configuration logic gate may perform one or more logic operations on the received configuration bits. The results of the logic operations are output from the outputs of configuration logic gate and are applied to the inputs of various circuits included in the register for configuring the register for various operating modes.

For example, the outputs of the configuration logic gate may be connected to input (e.g., gate input) 415c of passgate 415b, input (e.g., gate input) 415h of passgate 415g, input (e.g., gate input) 420b of passgate 420a, input (e.g., gate input) 425b of passgate 425a, input (e.g., gate input) 430b of passgate 430a, and input (e.g., gate input) 380b of passgate 380a. The configuration bits may enable or disable the passgates. The selective enabling and disabling of the passgates and the application of the various control bits to the logic gates establish the functionality of the register.

FIG. 4 shows a table of select signals that may be applied to select lines of the multiplexer for configuring the output from the multiplexer into the register for enabling or clearing the register. The select signals are labeled CE (clock enable) and nSCLR (negative edge trigger synchronous clear). When CE and nSCLR are both 0, then the register input is the Q state of the slave latch (i.e., hold the previous state of the slave latch) of the register. When CE and nSCLR are both 0 and 1, respectively, then the register input is the Q state of the slave latch of the register. When CE and nSCLR are both 1 and 0, respectively, then the register input is 0 (i.e., synchronous clear of the register). When CE and nSCLR are both 1, then the register input is the combinatorial-input (i.e., a registered function of the register).

FIG. 5 shows a table of the operating modes of the register and shows the states of the configuration bits, control signals, and clocks for the operating modes, in an embodiment. Each row in the table represents an operating mode of the register and includes row entries that summarize the operating modes. The row entries that summarize the operating modes are the Configuration Flip Flop (FF) Mode (sometimes referred to as the configuration mode of the register) column and the Properties column. Each row includes a set of configuration bits and control signals that may be applied to the register to configure the register to enter an operating mode. The configuration bits include c_flop, and c_wire and the control signals include frzlogic and dftunload. The clock signals include ML, MS, MH, SL, SS, and SH, which may be applied to the passgates of the register. The configuration bits may be stored in the CRAM for the various operating modes of the register. After the configuration bits, the control signals, or both are logically operated on by logical equations (e.g., Boolean logic equations) of configuration logic gate 305, the results of the logic equations are applied to various circuits in the register, such as the passgates and the logic gates. The modes of operation of the register that are summarized in the table in FIG. 5 are described further below.

Figure 6:
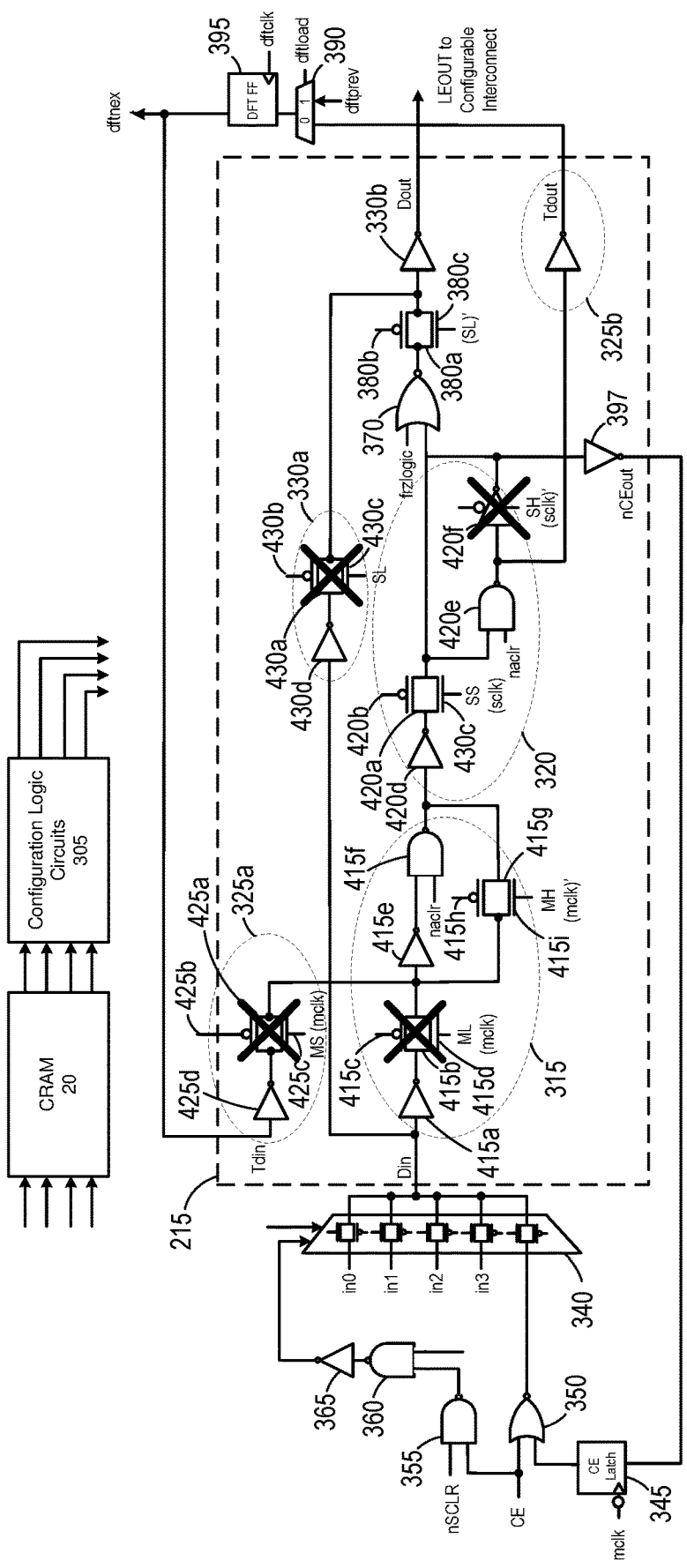
FIG. 6 shows the configuration of the register for the fast configuration mode and the enter regscan (register scan) mode for row one of the operating modes table shown in FIG. 5, in an embodiment.

FIG. 6 shows the configuration of the register for the configuration mode and enter regscan (register scan) mode for row one of the operating modes table shown in FIG. 5, in an embodiment. In the configuration mode and enter regscan mode, passgates 415b, 425a, and 430a are disabled and tristate buffer 420f is disabled. Passgates 415g, 420a, and 380a are enabled. The control signals applied to the register include frzlogic=1 and dftunload=0. The frzlogic signal may be applied to the second input of logic gate 370. The dftunload signal may be used by the configuration logic gate for configuring the register.

In configuration mode and enter regscan mode, frzlogic=1, forces the logic element output (LEOUT) to a high state. Frzlogic=1 also forces naclr=0 so that async-clear is asserted on inputs of logic gates 415f and 420e of the master latch and the slave latch to prevent the latches from switching states. Specifically, the feedback loops of the master latch is enabled and held to a zero value when entering this mode.

Figure 7:
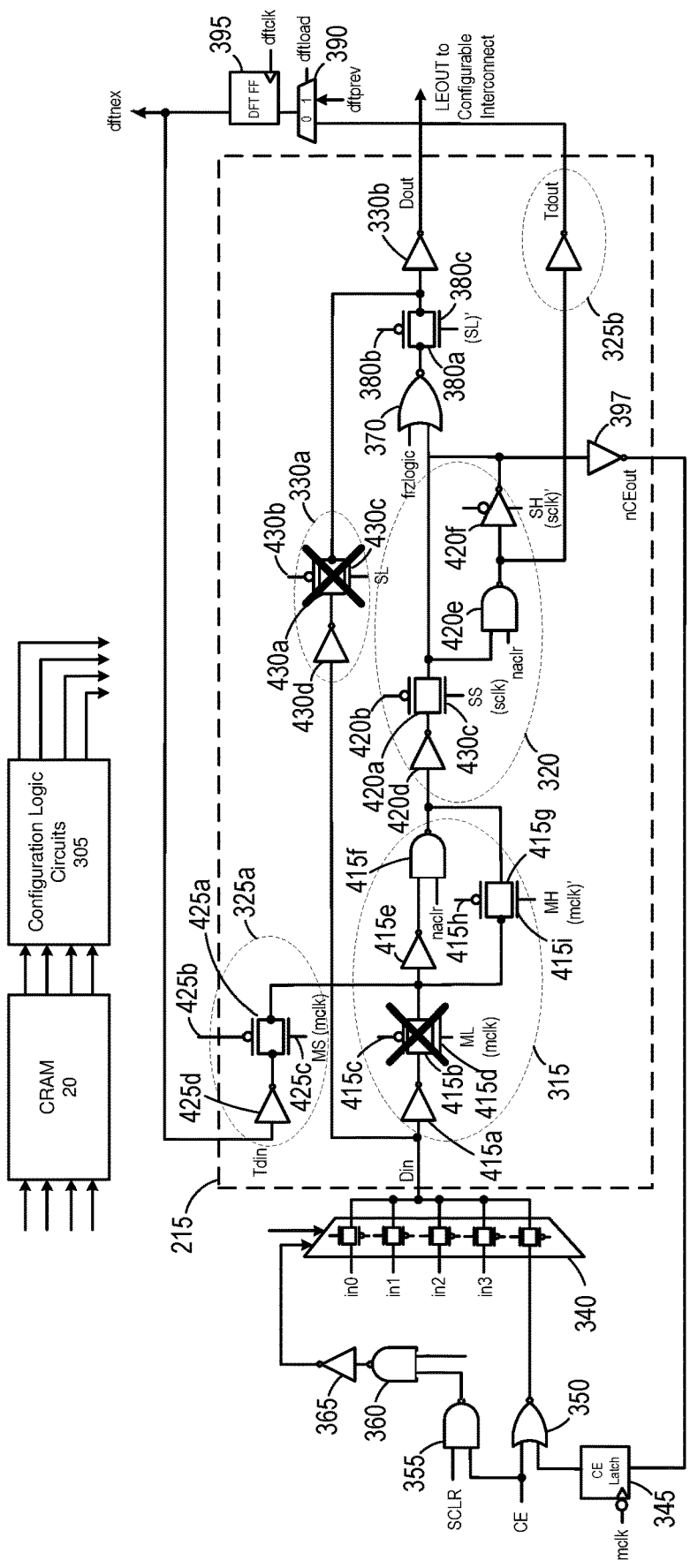
FIG. 7 shows the configuration of the register for the exit regscan mode for row two of the operating modes table shown in FIG. 5, in an embodiment.

FIG. 7 shows the configuration of the register for the exit regscan mode for row two of the operating modes table shown in FIG. 5, in an embodiment. In the exit regscan mode, passgates 415b and 430a are disabled. Passgates 415g, 420a, 425a, and 380a are enabled and tristate buffer 420f is enabled. With passgates 415b and 430a disabled, Din into the master latch is blocked, but the feedback loop of the master latch is enabled. The slave latch is also enabled. The combinatorial circuit path is disabled. In the exit regscan mode the DFT circuit path is enabled and the master latch receives and captures the Tdin signal that is transferred to the master latch from the ASIC emulation and DFT circuit 325a. The Tdin signal may be clocked from the DFT flip-flop 395 using the dftlclk signal. The input to the DFT flip-flop is set by multiplexer 390 and may be the dftprev signal or the Tdout output signal from the ASIC emulation and DFT circuit 325b. The Tdout signal may be transmitted through the master and slave latches from Tdin to Tdout. In exit regscan mode, frzlogic=1 and forces the logic element output (LEOUT) to a high state.

Figure 8:
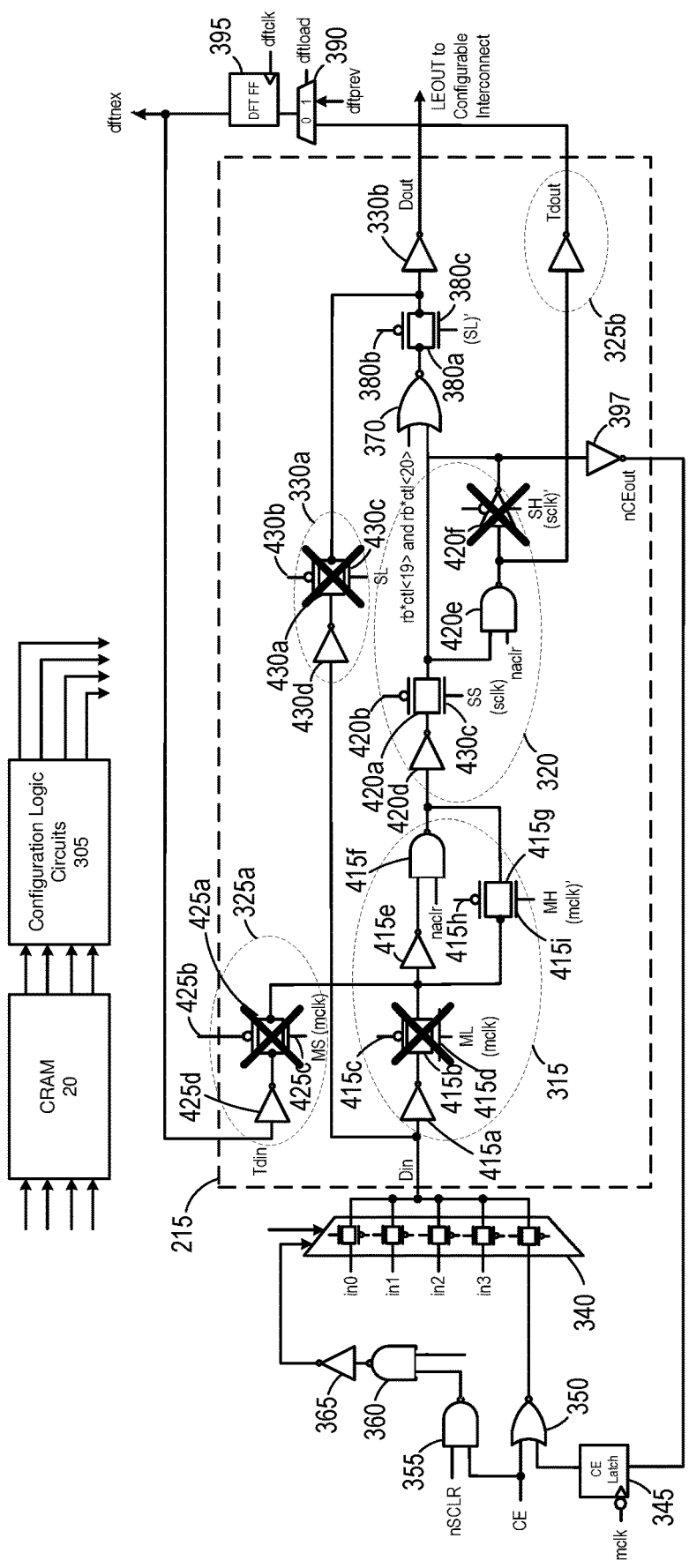
FIG. 8 shows the configuration of the register for the unused mode (e.g., default configuration mode), which may be a user mode, in an embodiment.

FIG. 8 shows the configuration of the register for an unused mode (e.g., default configuration mode), which may be a user mode, in an embodiment. The mode of the register shown in FIG. 8 is for row three of the operating modes table shown in FIG. 5. For the unused mode and default mode, passgates 415b, 425a, and 430a are disabled and tristate buffer 420f is disabled. Passgates 415g, 420a, and 380a are enabled. The control signals applied to the register include frzlogic=0 and dftunload=0. The frzlogic signal may be applied to the second input of logic gate 370. The dftunload signal may be used by the configuration logic gate for configuring the register.

CRAM bits referred to as rb*ctl<19> and rb*ctl<20> bits are set to a default of 0 and one or both may be applied to one of the inputs of logic gate 370 in the registered circuit path. The CRAM bits rb*ctl<19> and rb*ctl<20> set to the default value of 0, allows the LEOUT to remain HIGH when entering this user mode. Thus, the unused LEOUT is not allowed to switch from 1 to 0 when entering this user mode when frzlogic is de-asserted from the input of logic gate 370.

Figure 9:
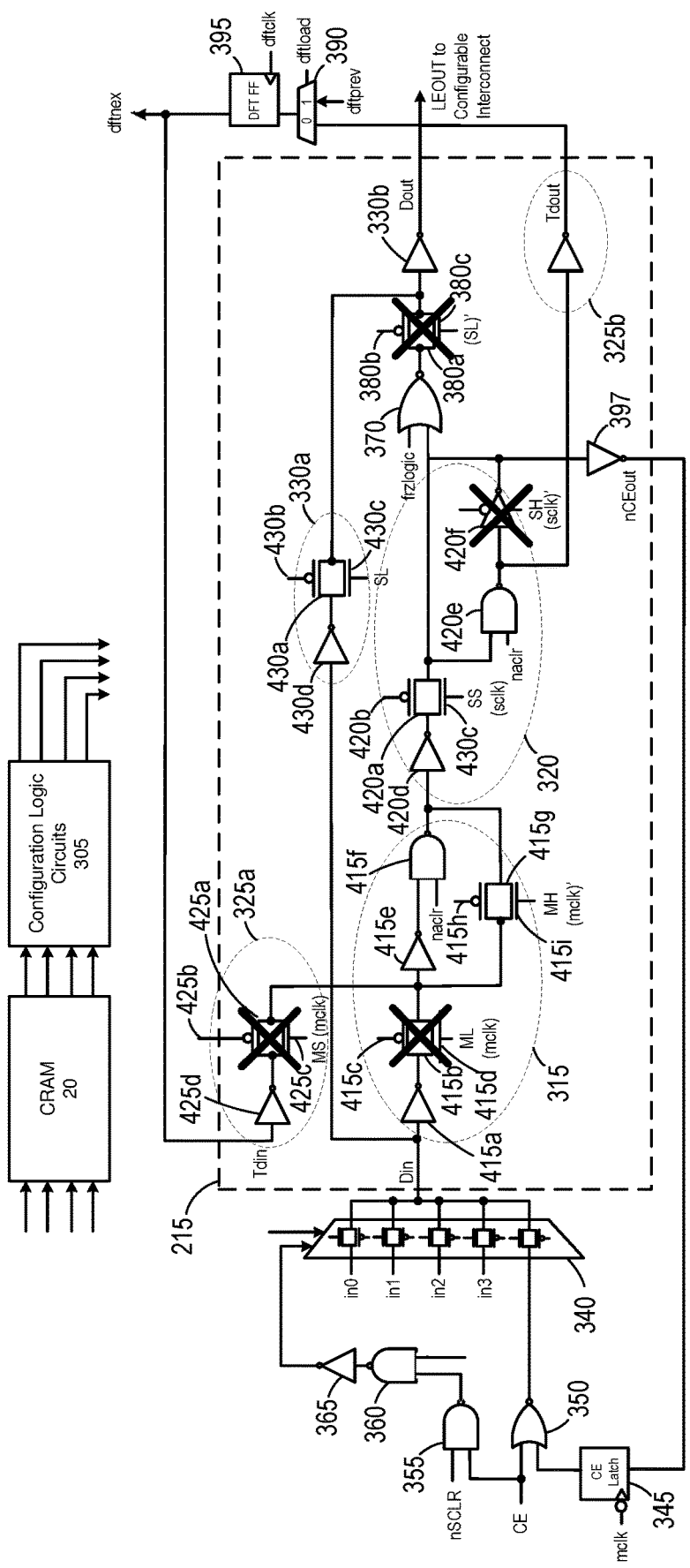
FIG. 9 shows the configuration of the register for the wire mode (e.g., bypass mode), which may be a user mode, in an embodiment.

FIG. 9 shows the configuration of the register for a wire mode (e.g., bypass mode), which may be a user mode, in an embodiment. The mode of the register shown in FIG. 9 is for row four of the operating modes table shown in FIG. 5. For the wire mode and bypass mode, passgates 415b, 425a, and 380a are disabled and tristate buffer 420f is disabled. Passgates 415g, 420a, and 430a are enabled to avoid internal nodes from floating and avoids contention between paths when entering user mode. The control signals applied to the register include frzlogic=0 and dftunload=0. The frzlogic signal may be applied to the second input of logic gate 370. The dftunload signal may be used by the configuration logic gate for configuring the register.

Inputs to multiplexer 340 that are selected for output from the multiplexer to Din are driven to output LEOUT by circuits 430d and 430a of combinatorial circuit 330a of the combinatorial circuit path. Various inputs that may be applied to the inputs of the multiplexer include output from the lookup table (LUT), and adder of the configurable IC die, inputs driven from the configurable interconnect (e.g., LEIMA input, LEIMB input), or other inputs that may be applied to the inputs of the multiplexer. These inputs will be well known to those of skill in the art.

Figure 10:
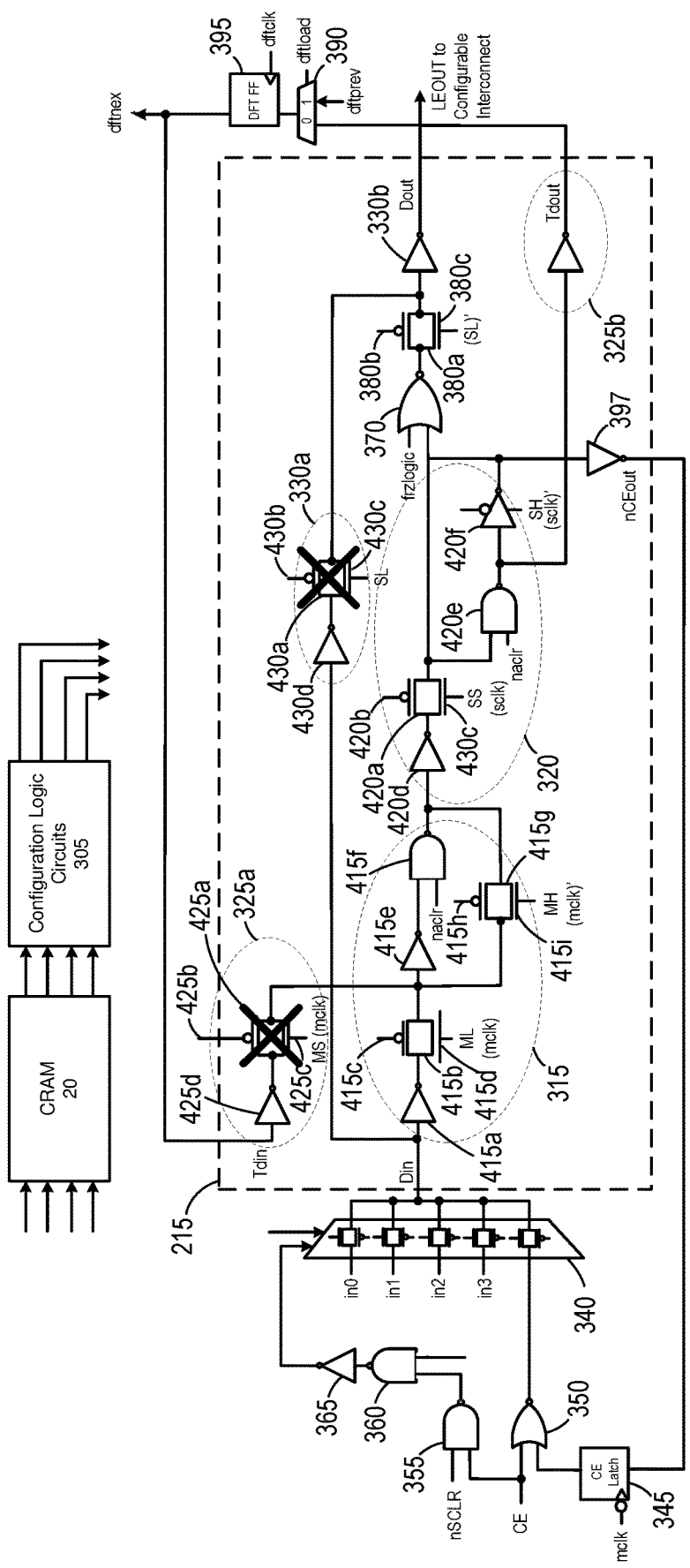
FIG. 10 shows the configuration of the register for the register mode, the latch mode, and the continuous window-based time borrowing mode, which may be a user mode, in an embodiment.

FIG. 10 shows the configuration of the register for the register mode, latch mode, and continuous window-based time borrowing mode, which may be a user mode, in an embodiment. The mode of the register shown in FIG. 10 is for row five of the operating modes table shown in FIG. 5. For the register mode, latch mode, and continuous window-based time borrowing mode, passgates 425a and 430a are disabled. Passgates 415b, 415g, 420a, and 380a are enabled and tristate buffer 420f is enabled. That is, the registered circuit path is enabled and the combinatorial circuit path is disabled. The control signals applied to the register include frzlogic=0 and dftunload=0. The frzlogic signal may be applied to the second input of logic gate 370.

When the register mode, latch mode, and continuous window-based time borrowing mode are entered, a predetermined register value is set to 0, for example by applying a control signal to at least one of the asynchronous clear inputs (e.g., preset (PST) and clear (CLR)) of the register. The register mode, latch mode, and continuous window-based time borrowing mode are set by the mclk and the sclk (which may be phase shifted with respect to each other) configurations. For the register mode, the register may be configured for an unskewed ETFF (edge-triggered flip-flop) mode or a skewed ETFF mode by use of the mclk or sclk. For register operation in the unskewed-ETFF mode, the mclk may be the non-delayed labclk (LAB clock) and the sclk may be the non-delayed labclk. For register operation in the skewed-ETFF mode, the mclk may be the delayed labclk (e.g., LAB clock phase shifted) and the sclk may be the delayed labclk. For the continuous window-based time borrowing mode of operation of the register, the mclk may be delayed labclk and the sclk may be the non-delayed labclk (out of phase with the mclk). For the latch mode of operation of the register, the mclk may be the non-delayed labclk and the sclk may be the VCC.

Figure 11:
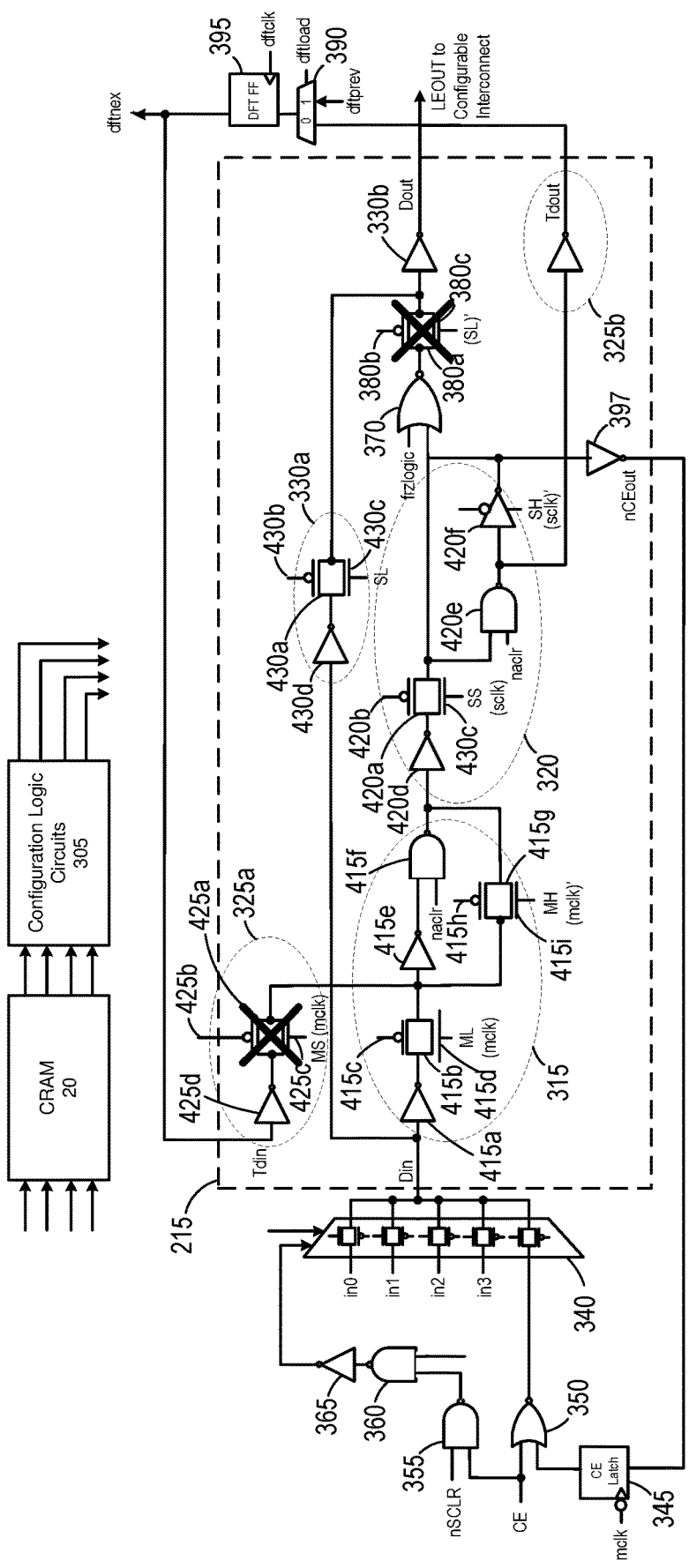
FIG. 11 shows the configuration of the register for the HiPi (highly pipelined) retiming mode, which may be a user mode, in an embodiment.

FIG. 11 shows the configuration of the register for the HiPi (highly pipelined) retiming mode, which may be a user mode, in an embodiment. The mode of the register shown in FIG. 11 is for row six of the operating modes table shown in FIG. 5. For the HiPi retiming mode, passgates 425a and 380a are disabled. Passgates 415b, 415g, 420a, and 430a are enabled and tristate buffer 420f is enabled. That is, the registered circuit path and the combinatorial circuit path are enabled. The control signals applied to the register include frzlogic=0 and dftunload=0. The frzlogic signal may be applied to the second input of logic gate 370.

Register 215 supports HiPi retiming when CE or SCLR are applied to the multiplexer select lines. When the register is retimed and CE=1, LEOUT is either sync-clear or the output from the combinatorial circuit path. The nSCLR signal applied to the multiplexer sets whether sync-clear or the output from the combinatorial circuit path is output from LEOUT. When the register is retimed and CE=0, LEOUT holds a previous value of the register.

Figure 12:
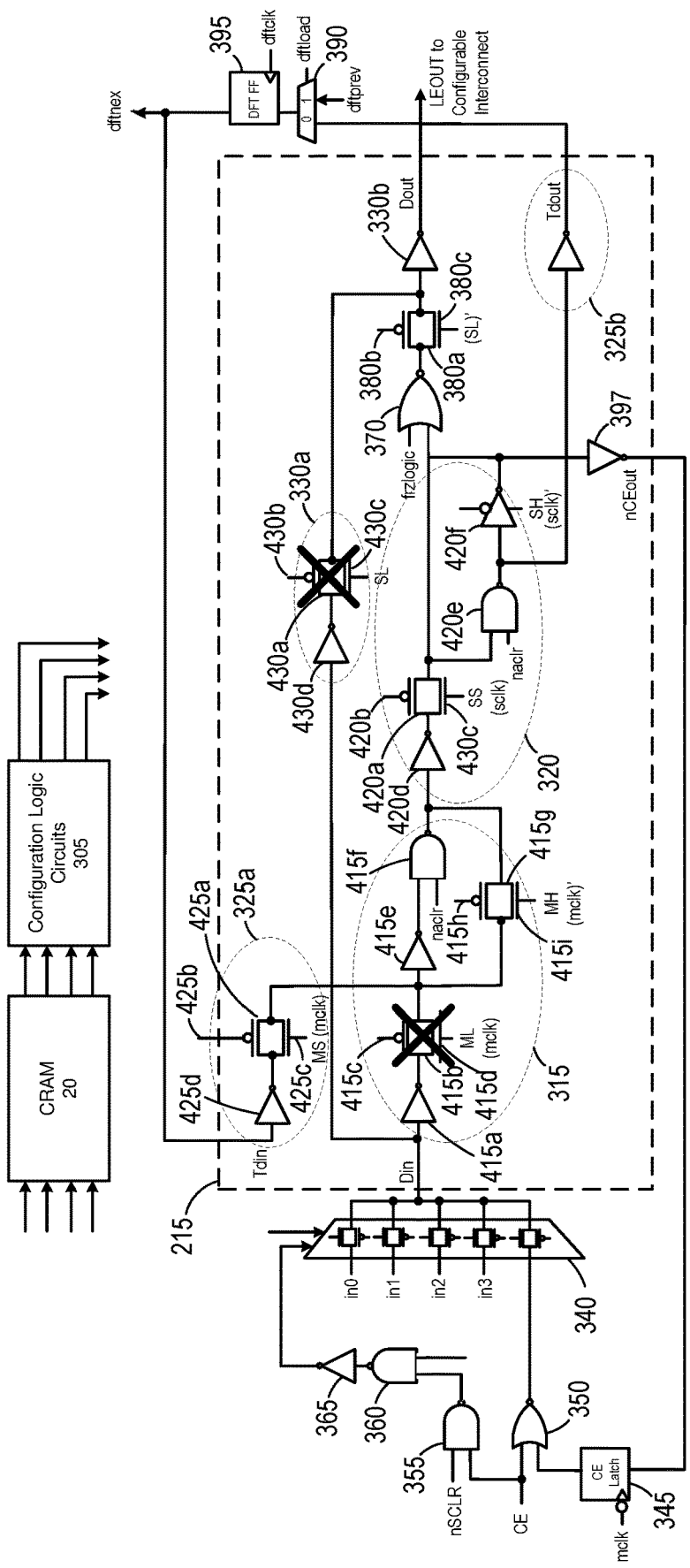
FIG. 12 shows the configuration of the register for the ASIC emulation mode, which may be a user mode with input for the register driven into Tdin from the DFT flip flop.

FIG. 12 shows the configuration of the register for the ASIC emulation mode, which may be a user mode with input for the register driven into Tdin from the DFT flip flop 395. The DFT flip flop 395 is used as a shadow register during ASIC emulation mode. The mode of the register shown in FIG. 12 is for row nine of the operating modes table shown in FIG. 5. For the ASIC emulation mode, passgates 415b and 430a are disabled. Passgates 415g, 420a, 425a, and 380a are enabled and tristate buffer 420f is enabled. The control signals applied to the register include frzlogic=0 and dftunload=1. The frzlogic signal may be applied to the second input of logic gate 370. ASIC emulation is supported by the register when the register is configured for registered mode and latch mode. LEOUT is the registered output.

FIG. 12 also shows the configuration of the register for the test capture mode, which may be configured in an unused mode or a registered mode. The test capture mode of the register is summarized by row seven and nine of the operating modes table shown in FIG. 5. For the test capture mode, the input is driven into the register from Tdin of the DFT logic gate 325a and 325b instead of Din from the multiplexer. The register output is routed to DFT flip flop 395 through the Tdout from buffer 325b. The LEOUT is high when the register is configured for the unused mode. The LEOUT is the registered output when the registered is configured as the register mode, latch mode, and continuous window-based time-borrowing mode.

Figure 13:
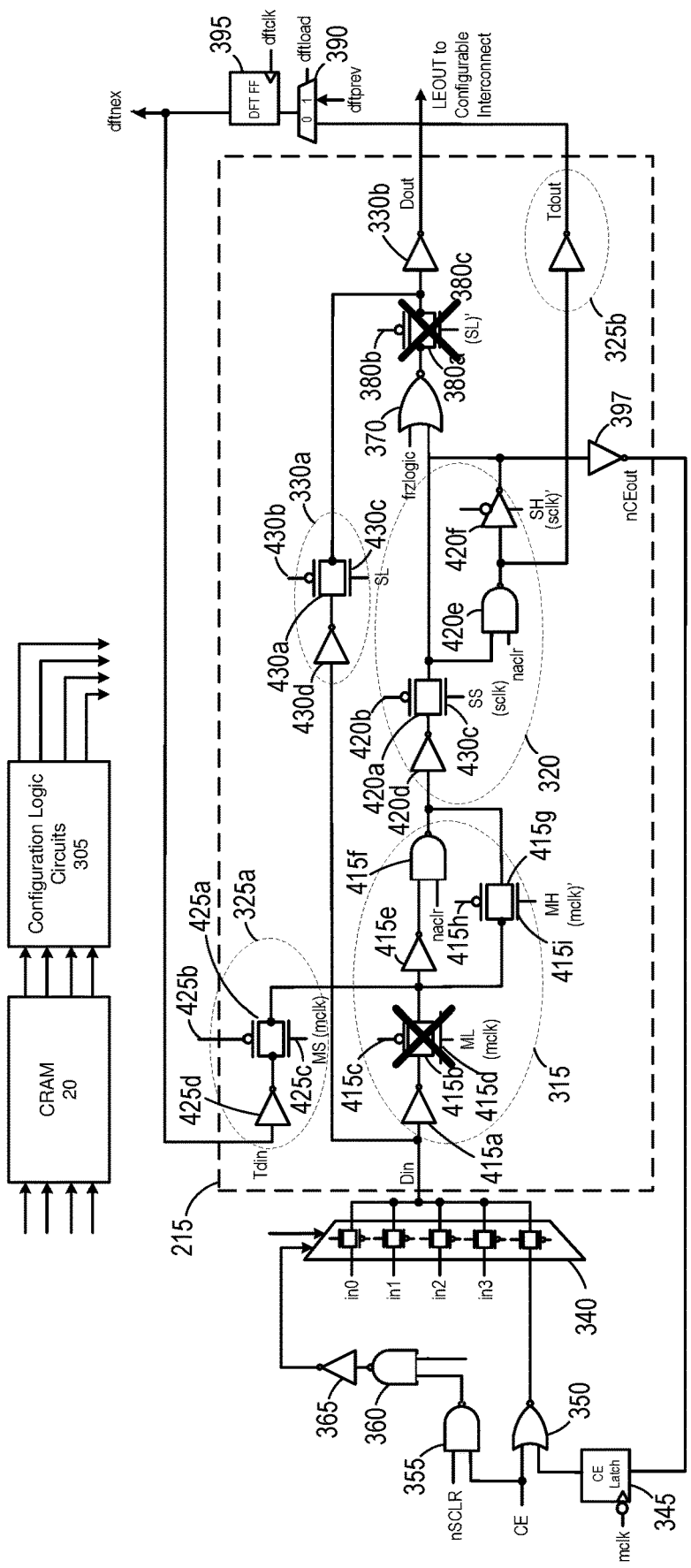
FIG. 13 shows the configuration of the register for the test capture mode for the wire mode and the HiPi retiming mode, in an embodiment.

FIG. 13 shows the configuration of the register for the test capture mode for the wire mode and the HiPi retiming mode, in an embodiment. The mode of the register shown in FIG. 13 is for row eight and ten of the operating modes table shown in FIG. 5. For the test capture mode for the wire mode and the HiPi retiming mode, passgates 415b and 380a are disabled. Passgates 415g, 420a, 425a, and 430a are enabled and tristate buffer 420f is enabled. The control signals applied to the register include frzlogic=0 and dftunload=1. The frzlogic signal may be applied to the second input of logic gate 370.

For the test capture mode, input to the register is driven from Tdin instead of Din. The register output is routed to the DFT flip flop 395 through the Tdout from buffer 325b. The LEOUT is the output of the combinatorial circuit path driven from the LUT, Adder, LEIMA, LEIMB, or the CE latch output depending on the select states applied to the select inputs of the multiplexer.

Various figures show the progression of the operating modes of the register for various register purposes, in an embodiment. For example, FIG. 6 shows the state of the register in the enter regscan mode and in the regscan shift mode where frzlogic=1 and dftunload=0. FIG. 7 shows the register entering the exit regscan mode from the enter regscan mode where frzlogic=1 and dftunload=1. FIG. 12 shows the state of the register transitioning from the exit regscan mode to the test capture mode where frzlogic=0 and dftunload=1. FIG. 8 shows the state of the register transitioning from the exit regscan mode to the user mode: the register is configured to unused mode (default mode) with configuration bits c_flop=0 and c_wire=0, where the frzlogic=0 and dftunload=0.

In another example of a progression of the operating modes of the register, FIG. 6 shows the state of the register in the enter regscan mode and in the regscan shift mode where frzlogic=1 and dftunload=0. FIG. 7 shows the register entering the exit regscan mode from the enter regscan mode where frzlogic=1 and dftunload=1. FIG. 13 shows the state of the register transitioning from the exit regscan mode to the test capture modes where frzlogic=0 and dftunload=1. FIG. 9 shows the state of the register transitioning from the exit regscan mode to the wire mode (e.g., bypass mode) with configuration bits c_flop=0 and c_wire=1, where the frzlogic=0 and dftunload=0.

In another example of a progression of the operating modes of the register, FIG. 6 shows the state of the register in the enter regscan mode and in the regscan shift mode where frzlogic=1 and dftunload=0. FIG. 7 shows the register entering the exit regscan mode from the enter regscan mode where frzlogic=1 and dftunload=1. FIG. 12 shows the state of the register transitioning from the exit regscan mode to the test capture mode where frzlogic=0 and dftunload=1. FIG. 10 shows the state of the register transitioning from the exit regscan mode to the user mode: the register is configured to register mode, latch mode, and continuous window-based time-borrowing mode with configuration bits c_flop=1 and c_wire=0, where frzlogic=0 and dftunload=0.

In another example of a progression of the operating modes of the register, FIG. 6 shows the state of the register in the enter regscan mode and in the regscan shift mode where frzlogic=1 and dftunload=0. FIG. 7 shows the register entering the exit regscan mode from the enter regscan mode where frzlogic=1 and dftunload=1. FIG. 13 shows the state of the register transitioning from the exit regscan mode to the test capture mode where frzlogic=0 and dftunload=1. FIG. 11 shows the state of the register transitioning from the exit regscan mode to the HiPi retime mode with configuration bits c_flop=1 and c_wire=1, where frzlogic=0 and dftunload=0. Other series of the figures show other operation modes transitions of the register for other purposes in other embodiments.

Timing improvements facilitated by register 215 compared to registers that include a number of circuits in the register circuit path or in the combinatorial circuit path may be up to a 22% improvement in timings such as the setup timing for the register and the output timing of the register. The timing improvements allow for higher binouts for dies that would otherwise have lower binouts.

EXAMPLES

The following examples pertain to further embodiments.

Example 1 is a configurable IC die comprising a register of a logic element of a logic array block comprises a registered circuit path and a combinatorial circuit path, wherein the registered circuit path and the combinatorial circuit path are in parallel, and a design for test (DFT) circuit path that comprises an input in the registered circuit path and an output in the registered circuit path, wherein the DFT circuit path is not in series with the registered circuit path.

Example 2 is a die of example 1, wherein the registered circuit path comprises a master latch and a slave latch that is in series with the master latch, the input of the DFT circuit path is in a feedback loop of the slave latch and the output of the DFT circuit path is in a feedback loop of the master latch.

Example 3 is a die of example 2, wherein the feedback loop of the master latch includes a butter, a logic gate, and a passgate to hold a state of the master latch when the DFT circuit path is selected for operation.

Example 4 is a die of example 3, wherein the DFT circuit path comprises a passgate to receive a first configuration signal, the logic gate of the master latch is to receive a second configuration signal, and the first and second configuration signals applied to the passgate and the logic gate enable the DFT circuit path when the first and second configuration signals are applied.

Example 5 is a die of example 3, wherein the feedback loop of the slave latch includes a logic gate and a tristate buffer to hold a state of the slave latch when the DFT circuit path is selected for operation.

Example 6 is a die of example 2, wherein the master latch comprises an input that is the input for the register and the input for the master latch is not the output for the DFT circuit path.

Example 7 is a die of example 1, wherein the DFT circuit path is not in series with the combinatorial circuit path.

Example 8 is a die of example 1, further comprising a clock enable (CE) time-borrowing circuit path, wherein the CE time-borrowing circuit path comprises an input in the registered circuit path and an output that is coupled to the input of the registered circuit path, and the CE time-borrowing circuit path is not in series with the registered circuit path.

Example 9 is a die of example 8, wherein the CE time-borrowing circuit path is not in series with the combinatorial circuit path.

Example 10 is a die of example 1, wherein the register comprises a logic gate that is in series with the master latch and the slave latch and is in series with the combinatorial circuit path to block transmission from the registered circuit path and the combinatorial circuit path to an output of the register when DFT circuit path is operational in the register.

Example 11 is a die of example 1, wherein the configurable IC die is a field programmable gate array and the logic element comprising the register is in a core fabric of the field programmable gate array.

Example 12 is circuit of a configurable IC die comprising: a register of a logic element of a logic array block, wherein the register comprises a registered circuit path and a combinatorial circuit path and the registered circuit path and the combinatorial circuit path are in parallel, and a CE time-borrowing circuit path, wherein the CE time-borrowing circuit path comprises an input in the registered circuit path and an output that is coupled to the input of the registered circuit path, and the CE time-borrowing circuit path is not in series with the registered circuit path.

Example 13 is a die of example 12, wherein the CE time-borrowing circuit path is not in series with the combinatorial circuit path.

Example 14 is a die of example 12, wherein the register comprises a design for test (DFT) circuit path that comprises an input in the registered circuit path and an output in the registered circuit path, wherein the DFT circuit path is not in series with the registered circuit path.

Example 15 is a die of example 14, wherein the registered circuit path comprises a master latch and a slave latch that is in series with the master latch, the input of the DFT circuit path is in a feedback loop of the slave latch and the output of the DFT circuit path is in a feedback loop of the master latch.

Example 16 is a die of example 15, wherein the master latch comprises an input that is the input for the register and the input for the master latch is not the output for the DFT circuit path.

Example 17 is a die of example 15, wherein the DFT circuit path is not in series with the combinatorial circuit path.

Example 18 is a die of example 12, wherein the configurable IC die is a field programmable gate array and the logic element comprising the register is in a core fabric of the field programmable gate array.

Example 19 is a configurable IC die comprising: a core fabric that comprises a plurality of logic array blocks, wherein each logic array block comprises a plurality of logic elements; and a plurality of registers, wherein each logic element comprises at least one of the registers and each register comprises a registered circuit path and a combinatorial circuit path, wherein the registered circuit path and a combinatorial circuit path are in parallel; a design for test (DFT) circuit path that comprises an input in the registered circuit path and an output in the registered circuit path, wherein the DFT circuit path is not in series with the registered circuit path and is not in series with the combinatorial circuit path; and a clock enable (CE) time-borrowing circuit path, wherein the CE time-borrowing circuit path comprises an input in the registered circuit path and an output that is coupled to the input of the registered circuit path, and the CE time-borrowing circuit path is not in series with the registered circuit path and is not in series with the combinatorial circuit path.

Example 20 is a die of example 19, wherein the registered circuit path comprises a master latch and a slave latch that is in series with the master latch, the input of the DFT circuit path is in a feedback loop of the slave latch and the output of the DFT circuit path is in a feedback loop of the master latch.

This description has been presented for the purposes of illustration and description. It is not intended to be exhaustive or to limit the invention to the precise form described, and many modifications and variations are possible considering the teaching above. For example, while example devices have been described above with specific logic states specified as 1, 0, high, and low, other states may apply for different circuit logic that maintains the described functionality. The embodiments were chosen and described in order to best explain the principles of the embodiments and their practical applications. This description will enable others skilled in the art to best utilize and practice the invention in various embodiments and with various modifications as are suited to a particular use. The scope of the invention is defined by the following claims.

The invention claimed is:

1. A circuit comprising:
a register that comprises a registered circuit path and a combinatorial circuit path, wherein the registered circuit path and the combinatorial circuit path are in parallel, and
a design for test (DFT) circuit path that comprises an input in the registered circuit path and an output in the registered circuit path,
wherein the registered circuit path comprises a first latch and a second latch that is in series with the first latch, wherein the input of the DFT circuit path is in a first feedback loop of the second latch, and wherein the output of the DFT circuit path is in a second feedback loop of the first latch.

2. The circuit of claim 1, wherein the first feedback loop comprises a logic gate coupled to a buffer.

3. The circuit of claim 1, wherein the second feedback loop comprises a buffer, a logic gate, and a passgate to hold a state of the first latch when the DFT circuit path is selected for operation.

4. The circuit of claim 1, wherein the DFT circuit path comprises a passgate, and wherein the first latch comprises a logic gate.

5. The circuit of claim 1, wherein the first feedback loop comprises a logic gate and a buffer to hold a state of the second latch when the DFT circuit path is selected for operation.

6. The circuit of claim 1, wherein the combinatorial circuit path comprises a buffer coupled to a passgate.

7. The circuit of claim 1, wherein the DFT circuit path comprises a buffer and a passgate.

8. The circuit of claim 1, further comprising a clock enable (CE) time-borrowing circuit path, wherein the CE time-borrowing circuit path comprises an input in the registered circuit path and an output that is coupled to an input of the registered circuit path.

9. The circuit of claim 8, wherein the CE time-borrowing circuit path comprises a buffer, a third latch, and a logic gate.

10. The circuit of claim 1, wherein the register further comprises a logic gate that is coupled to an output of the second latch.

11. The circuit of claim 1, wherein the circuit is in a field programmable gate array and the register is in a core fabric of the field programmable gate array.

12. A circuit comprising:
a register of a logic element, wherein the register comprises a registered circuit path and a combinatorial circuit path, and wherein the registered circuit path and the combinatorial circuit path are in parallel, and
a clock enable (CE) time-borrowing circuit path, wherein the CE time-borrowing circuit path comprises an input in the registered circuit path and an output that is coupled to an input of the registered circuit path.

13. The circuit of claim 12, wherein the CE time-borrowing circuit path comprises a buffer, a latch, and a logic gate.

14. The circuit of claim 12, further comprising:
a multiplexer coupled between the output of the CE time-borrowing circuit path and an input of the register.

15. The circuit of claim 12, wherein the register further comprises a design for test (DFT) circuit path, wherein the registered circuit path comprises a first latch and a second latch coupled to the first latch, wherein an input of the DFT circuit path is in a first feedback loop of the second latch, and wherein an output of the DFT circuit path is in a second feedback loop of the first latch.

16. The circuit of claim 15, wherein the DFT circuit path comprises a buffer and a passgate.

17. The circuit of claim 12, wherein the combinatorial circuit path comprises a buffer coupled to a passgate.

18. The circuit of claim 12, wherein the circuit is in a field programmable gate array and the logic element comprising the register is in a core fabric of the field programmable gate array.

19. An integrated circuit comprising:
a register that comprises a registered circuit path and a combinatorial circuit path, wherein the registered circuit path and the combinatorial circuit path are in parallel;
a design for test (DFT) circuit path that comprises an input in the registered circuit path and an output in the registered circuit path; and
a clock enable (CE) time-borrowing circuit path, wherein the CE time-borrowing circuit path comprises an input in the registered circuit path and an output that is coupled to an input of the registered circuit path.

20. The integrated circuit of claim 19, wherein the registered circuit path comprises a first latch and a second latch that is in series with the first latch, the input of the DFT circuit path is in a first feedback loop of the second latch and the output of the DFT circuit path is in a second feedback loop of the first latch.

* * * * *